United States Patent [19]
Nishino et al.

[11] Patent Number: 5,550,389
[45] Date of Patent: Aug. 27, 1996

[54] SUPERCONDUCTING DEVICE

[75] Inventors: Toshikazu Nishino, Kawasaki; Mutsuko Hatano, Kodaira; Haruhiro Hasegawa, Kokubunji; Hideaki Nakane, Hachioji; Ushio Kawabe, Tokyo; Kazuo Saitoh, Hachioji; Mitsuo Suga, Kokubunji; Kazumasa Takagi, Tokyo, all of Japan

[73] Assignee: Hitachi, Ltd., Tokyo, Japan

[21] Appl. No.: 171,869

[22] Filed: Dec. 22, 1993

Related U.S. Application Data

[63] Continuation-in-part of Ser. No. 744,823, Aug. 12, 1991, abandoned, which is a continuation of Ser. No. 441,951, Nov. 27, 1989, abandoned.

[30] Foreign Application Priority Data

| Nov. 28, 1988 | [JP] | Japan | 63-298095 |
| Mar. 3, 1989 | [JP] | Japan | 1-49830 |
| Jul. 26, 1989 | [JP] | Japan | 1-191444 |
| Dec. 22, 1992 | [JP] | Japan | 4-342353 |

[51] Int. Cl.⁶ ................... H01L 29/06
[52] U.S. Cl. ............ 257/30; 257/34; 257/36; 257/38; 257/39
[58] Field of Search ................ 357/5, 23.1, 4, 357/65, 67, 71; 257/30–39

[56] References Cited

U.S. PATENT DOCUMENTS

| 4,837,609 | 6/1989 | Gurvitch et al. | 357/71 |
| 4,843,446 | 6/1989 | Nishino et al. | 257/36 |
| 4,884,111 | 11/1989 | Nishino et al. | 357/65 |
| 4,893,156 | 1/1990 | Karasawa | 357/23.1 |
| 5,272,358 | 12/1993 | Nishino et al. | 257/36 |

FOREIGN PATENT DOCUMENTS

| 0181191 | 5/1986 | European Pat. Off. |  |
| 276746 | 8/1988 | European Pat. Off. | H01L 39/22 |
| 63-116477 | 5/1988 | Japan | 357/5 |
| 63-308975 | 12/1988 | Japan | 257/39 |
| WO90/04266 | 4/1990 | WIPO |  |

OTHER PUBLICATIONS

*Japanese Journal Of Applied Physics* (Part 2), vol. 26, No. 3, 1987, pp. 1617–1618, Tokyo, JP; Z. Ivanov et al.: *Three Terminal Josephson Junction with a Semiconductor Accumulation Layer*.

Datta, S. et al, "Novel Interference Effects Between Parallel Quantum Wells", *Physical Review Letters*, vol. 55, No. 21, Nov. 18, 1985, pp. 2344–2347.

Andreev, A. F., "The Thermal Conductivity Of The Intermediate State In Superconductors", *Soviet Physics JETP*, vol. 19, No. 5, Nov. 1964, pp. 1228–1231.

"Normal to Superconducting Current Conversion in Mesoscopic Semiconductor–Superconductor Structure", Nishino et al., Proc. 3rd Int. Symp. Foundations of Quantum Mechanics, Tokyo, 1989, 263–269.

"Carrier reflection at the superconductor–semiconductor boundary observed using a coplanar–point–contact injection", Nishino et al., Phys. Rev. B41, (1990) 7274–7276.

"Superconductivity and field effect transistors", *Japanese Journal of Applied Physics*, vol. 26, Supp. 26–3, Aug. 1987, pp. 1545–1546.

"Feasibility of hybrid Josephson field effect transistors", *Journal of Applied Physics*, vol. 51, No. 5, May 1980, pp. 2736–2743.

Patent Abstracts of Japan, vol. 7, No. 17, Jan. 1983, p. 1162 E 154.

(List continued on next page.)

Primary Examiner—J. Carroll
Attorney, Agent, or Firm—Kenyon & Kenyon

[57] ABSTRACT

A superconducting device low in power dissipation and high in operating speed is fabricated by use of a combination of a superconductor material and a semiconductor material. The superconducting device having a low power dissipation and high operating speed characteristic according to the present invention is suitable for configuring a large-scale integrated circuit.

5 Claims, 12 Drawing Sheets

OTHER PUBLICATIONS

"Study of Si–coupled superconducting field–effect transistor by tunnelling spectroscopy", *Proceedings International Electron Device Meeting*, San Francisco, CA 11th–14th Dec. 1988, pp. 286–289, IEEE.

"Monolithic device fabrication using high–Tc superconductor", *Proceedings International Electron Devices Meeting*, San Francisco, CA 11th–14th Dec. 1988, pp. 282–285.

Soviet Physics Journal of Experimental and Theoretical Physics, 1964, vol. 19, No. 5; The Thermal Conductivity of the Intermediate State in Superconductors, A. F. Andreev, pp. 1228–1231.

R. E. Drake et al., "$Mo_xSi_{1-x}$ Base Electrodes for Josephson Junctions," *IBM Technical Disclosure Bulletin*, vol. 21 (Sep. 1978) p. 1698.

P. Chaudhari et al., "Critical–Current Measurements in Epitaxial Films of $YBa_2Cu_3O_{7-x}$ Compound", *Physical Review Letters*, vol. 58 No. 25 (23 Jun. 1987) pp. 2684–2686.

a: CONTROL VOLTAGE NOT APPLIED
b, c: CONTROL VOLTAGE APPLIED

SUPERCONDUCTING DEVICE

This application is a continuation-in-part of U.S. patent application Ser. No. 07/744,823, filed on Aug. 12, 1991, now abandoned, which is a continuation of U.S. patent application Ser. No. 07/441,951, filed on Nov. 27, 1989, now abandoned.

BACKGROUND OF THE INVENTION

The present invention relates to an electronic device utilizing superconductive phenomena in particular to a superconducting device low in power dissipation and high in operating speed due to the operation by controlling carrier-wave, and suitably used for a large integrated circuit configuration.

In the conventional field of superconducting devices using superconductive phenomena, JP-A-60-231375 discloses a superconducting device of a type used as a combination of a superconductor and a normal conductor which is well known.

This conventional device, which uses a high-energy quasiparticle generated in a superconductor, requires an operating voltage larger than the gap energy of the superconductor, and therefore the problem of large power dissipation is posed in applications involving a high-temperature superconducting material of an oxide used for a superconductor. Further, this type of device has a disadvantage since its characteristics are considerably affected by change in temperature, thereby making it difficult to realize a stable circuit operation. Another disadvantage of this conventional device lies in its inability to secure a sufficient current gain for applications such as a logic circuit, and therefore a large-scale integrated circuit is difficult to realize.

Furthermore, in spite of its frequent applications to digital processing circuits, such a device lacks a parallel signal processing ability at the device level such as optical devices on the one hand, and a high degree of integration is impossible to attain an analog signal processing operation vital to the neuro-computer on the other.

SUMMARY OF THE INVENTION

Accordingly, the present invention provides a superconducting device which obviates the above-mentioned problems and is low in power dissipation and suited to a high-speed operation.

The present invention provides a superconducting device capable of handling the multi-valued logic (MVL) of binary or higher order which could be not realized by conventional superconducting devices.

The present invention also provides a superconducting circuit having the function of processing logic signals.

Additionally, the present invention provides a superconducting device having the ability of parallel signal processing which could not be realized by conventional superconducting devices.

The present invention further provides a superconducting device having the function of analog signal processing.

Other and further objects, features and advantages of the present invention will appear more fully from the following description.

In order to provide high speed capability with low power dissipation, there is provided according to the present invention a superconducting device comprising a first solid member such as a normal conductor for propagating carriers which follow Fermi statistics and a second solid member such as a superconductor containing carriers which follow Bose statistics, wherein the first and second solid members are disposed in contact with each other.

Furthermore, there is provided a superconducting device comprising means for supplying carriers into the first solid member (normal conductor), means for controlling the phase and/or amplitude of the wave-functions of carriers propagating in the first solid member, and means for detecting the carriers reflected in or around the interface between the second solid member (superconductor) and the first solid member (normal conductor) and propagating through the first solid member (normal conductor). In the description that follows, the first solid member will be referred to as the normal conductor, and the second solid member as the superconductor.

A special phenomenon of reflection that occurs when electrons are supplied from a normal conducting metal into a superconductor is well known as Andreev reflection. (Soviet Physics Journal of Experimental and Theoretical Physics, 1964, Vol. 19, No. 5; pp. 1228 to 1231) This phenomenon was first discovered by Andreev while researching heat conduction.

Andreev reflection is a phenomenon considered an induced phase-conjugate reflection in which electrons conducting in a normal conducting metal and entering a superconductor are reflected as holes, which in turn are caused to return by way of the same route as the electrons that have entered.

The present invention is intended to provide a novel superconducting device based on this phenomenon of reflection, and operated by the control of phase or/and amplitude of the wave functions of electrons or/and holes in the normal conducting material.

As explained above, this reflection is such that holes are returned when electrons are injected, and vice versa. In the device according to the present invention, therefore, this reflection phenomenon is observed as a resistance value or a current value between carrier-injection means (detection means) and a superconductor forming the interface. This resistance or current value may be controlled appropriately by control means.

In this phenomenon of reflection, carriers injected generally return to the original injection point, and therefore both the injection and detection points assume an identical position, thus making it possible to use a common means for both injection and detection.

The carriers based on Fermi statistics are basically electrons or holes.

The carriers following Bose statistics, on the other hand, are superconducting Cooper pairs specifically.

The above-mentioned reflection is an induced phase-conjugate reflection which can be described symmetrically with respect to time reversal in a wave function.

The phase and/or amplitude of the carriers propagating through the normal conductor are controllable by applying at least one of electric field, current, magnetic field, light and electromagnetic wave to the normal conductor.

More specifically, assume that an electric field is used for controlling the amplitude and/or phase. In the case where the normal conductor such as a semiconductor is n-type conductive, that is, in the case where the main current carriers are electrons, the control means is applied with a voltage positive with respect to the normal conductor; while in the case where the normal conductor is p-type conductive, that is, the main current carriers are holes, the control means is applied with a voltage negative with respect to the normal conductor. A predetermined electric field is thus applied to the normal conductor to increase the carrier concentration.

The superconducting coherence length in a normal conductor is generally proportional to one-third the power of the carrier concentration of the normal conductor, and therefore the coherence length is increased by the voltage application as mentioned above. As a result, the superconductivity caused by the superconducting proximity effect in the normal conductor is enhanced, so that reflection tends to occur more easily for an increased current (the controlled current flowing between the injecting means and the superconductor).

On the contrary, it is also possible to shorten the superconducting coherence length in the normal conductor. Specifically, the control means is impressed with a voltage negative with respect to the normal conductor when the normal conductor is n-type conductive, and a voltage positive with respect thereto when the normal conductor is p-type conductive.

In this case, the superconductivity caused in the normal conductor by the superconducting proximity effect is suppressed, so that the amount of reflection is decreased, thereby reducing the controlled voltage.

In the case where the phase and/or amplitude of carriers are controlled by a current, on the other hand, carriers are injected directly into a normal conductor between a superconductor and control means, for example. This injection shortens the superconducting coherence length in the normal conductor and suppresses the superconductivity caused therein by the superconducting proximity effect, with the result that reflection is less likely to occur, thereby reducing the controlled current flowing between the injection means and the superconductor.

In injecting the current, the normal conductor (semiconductor) may be either p-type or n-type conductive to achieve the goals of the present invention. The carriers used for injection may be either electrons or holes. In either case, the carriers in the normal conductor (semiconductor) are distributed in non-equilibrium fashion, and therefore the superconductive region extended into the normal conductor (semiconductor) by the superconducting proximity effect is reduced, thus making it possible to control the device characteristics.

A control conductor in ohmic contact with the normal conductor (semiconductor) may be used for injecting the current. The same purpose may of course be achieved by use of a junction or a contact having a comparatively large barrier, such as a p-n junction, a Schottky contact or a tunnel junction formed with an insulating film held therein.

In the event that the phase and/or amplitude of carriers are controlled by use of a magnetic field, the phase of the wave function of electrons or holes is changed to change the reflection coefficient. As a result, it is possible to change the potential difference between the superconductor and carrier-injection means, thus permitting the current therebetween to be controlled.

Further, when light is used to control the phase and/or amplitude of wave of carriers or wave-function of carriers, the superconducting device is configured to include at least a means for introducing light into the normal conductor. In this case, the device, which uses a superconducting state, requires cooling, and therefore is installed in a cryogenic environment. Therefore, optical fiber is used as the means for introducing the light described above to effectively reduce the attenuation of light and minimize the inflow of heat from an external environment.

The superconducting device according to the present invention may alternatively use an input of an electromagnetic wave to control the current. For this purpose, the superconducting device is configured to include at least means for introducing an electromagnetic wave into the normal conductor.

The properties of the wave function controlled by the aforementioned various control means may include only the phase of the wave function of the carriers propagated in a normal conductor, only the amplitude, or both the phase and amplitude of the carriers, depending on the position of the control means. If the phase is the only factor to be controlled, the control means may be disposed at a point away from where superconductivity diffuses into at least the normal conductor, that is, a point away from the interface between the superconductor and the semiconductor by a distance about five times (and preferably greater than ten times) the coherence length toward the normal conductor.

In the case where only amplitude of the electron or hole wave is controlled, on the other hand, the control means may be installed in at least a portion or over the whole of the part where superconductivity diffuses into the normal conductor, that is, an area within five times the coherence length toward the normal conductor from the interface between the superconductor and the normal conductor.

If both phase and amplitude of the electron or hole wave are to be controlled, by contrast, the control means is installed in such a manner as to cover both the normal conductor and the part where superconductivity diffuses into the normal conductor.

In order to secure this reflection, the height of the potential barrier against electrons or holes situated between the normal conductor and the superconductor is preferably less than one half the Fermi energy in the normal conductor, or more preferably, less than one third such Fermi energy.

In view of the fact that stable spatial change in superconductivity at or around the interface between the superconductor and normal conductor is important for assuring stable device operation, the means for controlling the carrier phase of carrier wave or carrier wave function is preferably situated at a distance more than three times (and preferably greater than ten times) the superconducting coherence length in the semiconductor where the superconductivity at or around the interface between the superconductor and normal conductor is not substantially affected by the control signal. In other words, the device is configured in such a manner that the reflection coefficient of electrons or holes is constant and in proximity to unity at or around the interface between the superconductor and normal conductor. Further, in order to prevent the signal for phase control from being disturbed by scattering of unnecessary carriers in the material, it is recommended that the length of the normal conductor portion between the superconductor and the means for injecting carriers into the normal conductor is preferably less than ten times, or more preferably less than five times, the mean free path of the carriers in the normal conductor (semiconductor). This length is also preferably greater than ten times a superconducting coherence length in the normal conductor (semiconductor).

A configuration for providing a superconducting device capable of handling multi-valued logic, will be explained below.

In the case where the means for injecting electrons or holes is configured of a superconductor, electrons or holes are repeatedly reflected at the interfaces between the superconductor making up the second solid member or the means for injecting electrons or holes respectively and the normal conductor. A special advantage in configuring the electron or hole injection means of a superconductor, therefore, lies in that the current flowing through the normal conductor and the superconductor in contact therewith is controlled to realize the same value of the current of differential resistance under different control conditions, thus realizing a superconducting device having a novel function capable of being operated in accordance with binary or multi-valued logic.

In order to provide a superconducting circuit having the function of processing logic signals, a superconducting device according to the present invention is combined with a tunnel-type Josephson device using a superconductor or a field effect superconducting transistor to make up a superconducting circuit. This configuration has an advantage in that both the circuit function and the signal-processing speed are improved, thereby providing a much preferred embodiment of the invention, making possible the sophisticated information processing which could not be realized by the prior art.

A superconducting device capable of parallel processing is achievable by disposing a plurality of means for injecting carriers into a normal conductor in contact with the normal conductor and controlling the currents flowing in the respective means. If a plurality of means for injecting carriers into the normal conductor are arranged in this way, it is possible to control the signals in parallel in the aforementioned case.

In order to provide a superconducting device that performs analog signal processing a superconducting device according to the present invention is configured of means for detecting the potential difference between a superconductor and carrier-injection means.

Furthermore, a superconducting transistor is structured by forming a plurality of first superconductors on a semiconductor to oppose a second superconductor on the semiconductor to input signals into the semiconductor from the plurality of first superconductors, forming a plurality of fourth superconductors on the semiconductor through an insulating film between the first superconductors and the second superconductor to perform weighting with respect to respective input signals, forming a third superconductor opposing the other end of the second superconductor, and forming a gate electrode between the second and third superconductors through an insulating film. This superconducting transistor is used as a threshold section, and the sum of the input signals which are weighted is compared with a predetermined threshold value. An output signal corresponding to the result of comparison is output as a voltage between the second and third superconductors.

According to the present invention, a material such as a metal or a semimetal is desirably used as a normal conductor. It is, however, most desirable to use a semiconductor as a normal conductor. In the case where a semiconductor material is used as a normal conductor, means for applying an electric field to the semiconductor is employed as means for controlling the controlled current mentioned above. Such a means may be configured to include a conductor disposed on the semiconductor-either directly or through a material having an electrical resistance larger than that of the semiconductor. In such a case, a superconducting device of transistor type is realized. This control means is not necessarily a single means for each device, but it is desirable for achieving the object of the invention to use means for applying selected one or a combination of any of the group of an electric field (voltage), a current, a magnetic field, light, an electromagnetic wave and the like signals or a plurality of such signal-application means at the same time.

In order to achieve the objects of the present invention, the injection means preferably has a forward end thereof in needle form 1 μm wide or less in contact with the normal conductor. It is desirable to dispose this injection means in contact with the normal conductor, but not with the superconductor. This is by reason of the fact that if carrier-injection (pouring) means is in direct contact with the superconductor, a leakage current, in addition to the normal signal controlled, would flow and the signal control sensitivity would be deteriorated.

It is also desirable for achieving the objects of the present invention that a superconducting device comprises means for detecting the potential difference between the means for injecting carriers into the normal conductor and the superconductor. The controlled signal appears as a potential difference between the means for injecting carriers into the normal conductor and the superconductor, which is a phenomenon sufficient to realize the basic operation of a superconducting device according to the present invention. It is, however, more desirable to use a device having an amplifying function such as a semiconductor transistor, a superconducting transistor or Josephson device as the above-mentioned means for detecting the potential difference, in which case a signal from the potential difference-detection means is applied directly as another control signal for the superconducting device.

If this signal is to be sensitively controlled, the energy as measured from Fermi level in the normal conductor of carriers injected in from the carrier-injection means into the normal conductor should be less than twice, or more preferably less than the same level as, the value of the gap energy at the operating temperature of the superconducting device.

Further, in order to minimize the scattering of electrons or holes having an adverse effect on the device operation due to crystal defects of the normal conducting material, the means for injecting carriers into the normal conductor are preferably mounted on the normal conductor, and the distance between the means and the interface between the superconductor and the normal conductor is desirably less than ten times, or more preferably less than five times, the mean free path of carriers in the normal conductor, and preferably greater than ten times the superconducting coherence length in the normal conductor.

To minimize the adverse effect which the scattering of electrons or holes might have on the device operation, the width of the carrier-injection means in contact with the normal conductor is preferably smaller than that of the superconductor in contact with the normal conductor.

Disposing the means for injection of electrons or holes in contact with the normal conductor in the same plane as the normal conductor in opposed relationship to the superconductor is very desirable for facilitating device integration. It is also obvious that the objects of the present invention are sufficiently achieved in such a manner that the means for injecting electrons or holes in contact with a normal conductor may alternatively be disposed in an opposed relationship to the superconductor with the normal conductor inbetween.

The semiconductor which may be used as a normal conductor according to the present invention may be constructed of a material selected from one of the group of materials including Si, Ge, InAs, GaAs, GaSb and InSb.

These materials are recommended since they are capable of easily controlling the above-mentioned signal for achieving the objects of the present invention. Aside from the conventional metal materials of superconductors, the use of ceramics as an oxide is also recommended for securing high-temperature operation of the device. In such a case, main component elements identical to those of the ceramics oxide material making up the superconductor are selected for the normal conductor thereby to prevent the device characteristics from being deteriorated by scattering of elements between the materials.

Current may of course be controlled by any one or combination of any of the group of an electric field (voltage), a current and a magnetic field signal to operate the device according to the present invention. This current control corresponds to a superconducting device providing a novel embodiment of the present invention operated by interference control of the wave function of electrons or holes injected into a normal conductor. This phenomenon of interference is also realizable by superimposition of the wave functions of two electrons or holes different in control condition by current control means disposed only for a portion of the normal conductor, as will be easily understood from the configuration of a superconducting device according to the present invention.

As described above, the material of a superconductor used according to the present invention may be a metal such as Nb or Pb, or a Pb alloy, or an intermetal compound of Nb such as NbN, $Nb_3Sn$, $Nb_3Ge$, $Nb_3Al$ or $Nb_3Si$. Further, a ceramics superconductor is recommended for high-temperature operation of the device. An example of such a material which sufficiently achieves the objects of the present invention may of course include a p-type oxide superconductor of Y group, an oxide superconductor of La group, an oxide superconductor of Bi group, or an oxide superconductor of Tl group. As an n-type superconductor, on the other hand, the use of an oxide ceramics superconductor composed of $Nd_{2-x}Ce_xCuO_y$ is preferable. The Nd portion of this compound may of course be replaced with equal effect by at least selected one of the elements including Pr, Pm, Sm, Eu, Gd and Er, or the Ce portion may be equally replaced by at least selected one of the elements including Th, Tl, Pb and Bi.

In place of an oxide ceramics superconductor having the composition $Nd_{2-x}Ce_xCuO_y$, the n-type superconductor used herein may be a compound having the composition $A_{2-x}N_x\text{-}CuO_y$, in which the element A is Sr and/or Ca and the element N maintains the basic crystal structure capable of taking a number of oxidizations more than 2+ value. Specifically, the objects of the present invention are achieved also by use of an oxide ceramics superconductor selected from the group of La, Ce, Pr, Nd, Sm, Gd, Td, Tl, Pb, Bi, Y and In, for example.

An alternative n-type superconductor which may be used according to the present invention has a composition $A_1N'_xCuO_y$, in which the element A is Sr and/or Ca and the element N' maintains the basic crystal structure having a number of oxidizations larger than 2+ value. Specifically, the objects of the present invention are achieved also by use of an oxide ceramics superconductor characterized by being selected from the group of La, Ce, Pr, Nd, Sm, Gd, Td, Tl, Pb, Bi, Y and In, for example. Further, when an oxide ceramic is used as a material of the superconductor according to the present invention, a normal conductor used therewith may be made of a material having the main component elements thereof identical to those of the oxide ceramics superconductor.

A superconducting device according to the present invention may be fabricated at least by the steps of forming a superconductor, injecting carriers into a normal conductor and forming means for controlling the phase of the carriers thus injected or poured. In this case, the means for injecting carriers into the normal conductor is preferably made of a normal conductive material, and it is more preferable for achieving the objects of the present invention if the material of the means for injecting carriers into the normal conductor is a superconductor.

It is also possible to fabricate a superconducting device according to the present invention by a method including at least the steps of processing a single sheet of superconducting thin film into two opposed superconducting electrodes apart from each other by a distance not more than ten times the mean free path of carriers and greater than ten times the superconducting coherence length and disposing a control electrode. In such a case, the electrodes are processed while the superconductor is formed at the same time, thus making it possible to easily fabricate a device of high integration with high yield.

As will be seen from the foregoing description, the present invention solves the problems of the prior art and realizes a superconducting device having an entirely novel function.

DETAILED DESCRIPTION

Each of the disclosed embodiments of the present invention will be explained in detail below with reference to the accompanying drawings.

According to a first embodiment of the present invention, the amplitude of carriers is controlled by a control means applying an electric field thereto.

Figure 1:
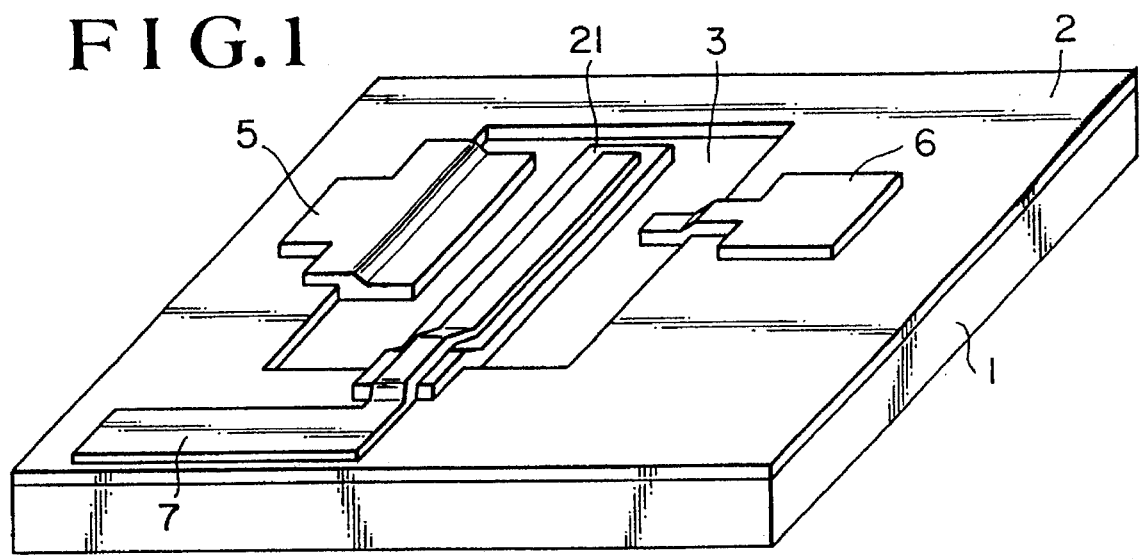
FIG. 1 is a perspective view showing a superconducting device according to a first embodiment of the present invention.
Figure 2:
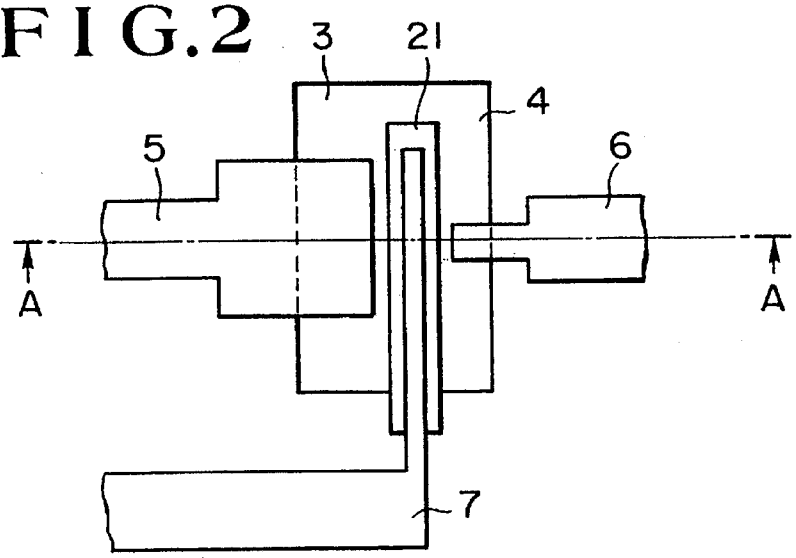
FIG. 2 is a partial plan view of a superconducting device according to the first embodiment of the present invention.
Figure 3:
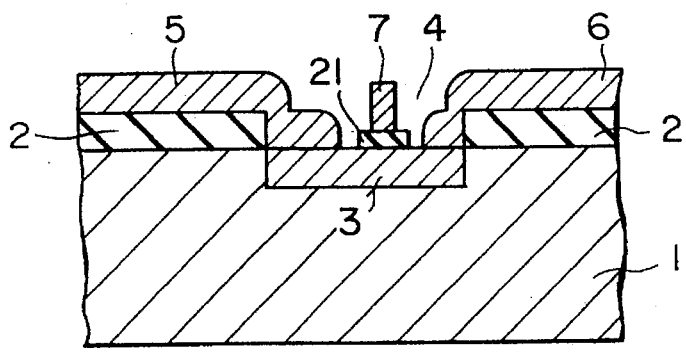
FIG. 3 is a sectional view of the superconducting device of the first embodiment taken along line A—A in FIG. 2.

The first embodiment of the present invention will be explained with reference to the FIGS. 1, 2 and 3. FIG. 1 is a diagram showing a part of a superconducting device in a perspective view according to the first embodiment of the present invention, FIG. 2 a plan view showing a part of the superconducting device, and FIG. 3 a sectional view taken in line A—A in FIG. 2. The surface of a substrate 1, made of a p-type silicon single crystal of (100) orientation, is formed with a layer insulating film 2 of $SiO_2$ about 100 nm in thickness by thermal oxidation, after which arsenic ions are injected in the surface to a concentration of $5 \times 10^{18}$ $cm^{-3}$, followed by heat treatment for 20 minutes at 900° C. in temperature in a nitrogen environment thereby to form an ion implanted layer 3. This portion corresponds to a normal conductor (first solid member) described above. The concentration of this ion-implanted layer 3 is $10^{15}$ to $1 \times 10^{20}$ ($cm^{-3}$) or preferably $10^{18}$ to $1 \times 10^{20}$ ($cm^{-3}$). An opening 4 of the layer insulating film 2 is then formed, and an Nb thin film about 100 nm thick is deposited by evaporation in an ultra-high vacuum as a superconductor. The thickness of this superconducting thin film is selected in a range suitable to the next step of micro-fabrication in a manner not to adversely affect the superconductivity of the material. Such a thickness, though set to about 100 nm in the embodiment under consideration, may alternatively be in the range from about 1 μm to about 10 nm or more preferably in the range from about 100 nm to about 10 nm.

A pattern is then formed by use of an electron-beam resist about 200 nm thick, and the above-mentioned Nb thin film is processed by the reactive ion etching process, thus forming a first superconductor 6 about 0.05 μm in width and a second superconductor 5 about 10 μm in width. The first superconductor 6 corresponds to the above-mentioned part which functions as the means for both injecting and detecting carriers. Also, the second superconductor 6 corresponds to the second solid member (superconductor) described above. It should be noted that the diagrams are not necessarily drawn on the same scale. A thin film made of $SiO_2$ about 10 nm thick is then formed as a gate insulator 21 by the chemical vapor deposition (CVD), after which an Al thin film about 200 nm thick is formed to provide a control electrode 7. A superconducting device according to the present invention is thus fabricated.

Figure 4:
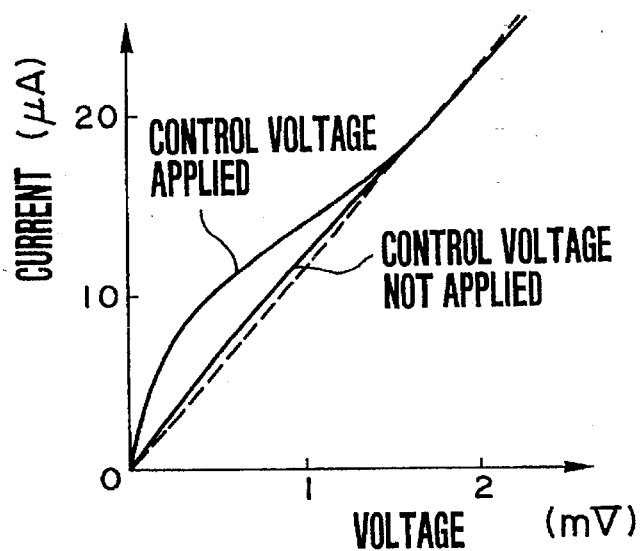
FIG. 4 shows characteristics obtained when a superconducting device according to the present invention is operated while being cooled in liquid helium.

When a superconducting device according to the present invention is operated while being cooled in a liquid helium, the characteristic shown in FIG. 4 is obtained. Specifically, the current-voltage characteristic between the first superconductor 6 and the second superconductor 5 is controllable by the voltage V applied between the ion implanted layer 3 and the control electrode 7, so that the superconducting device according to the present invention is usable as a device for an analog or digital circuit.

Figure 5:
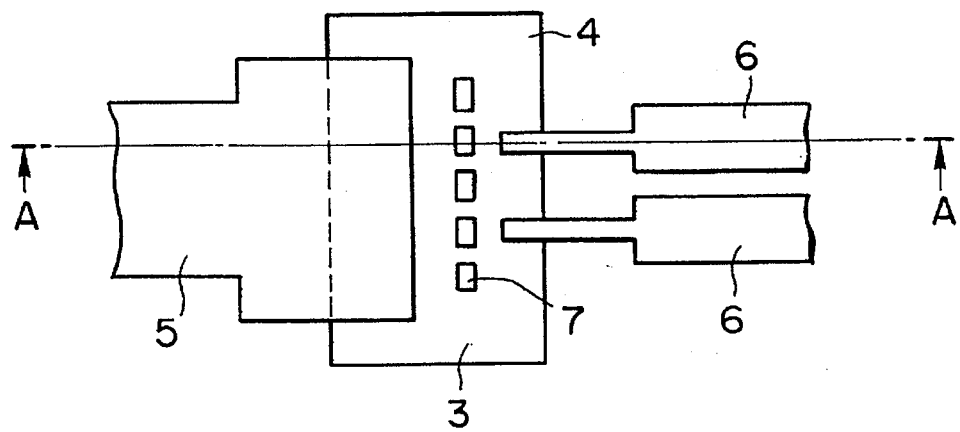
FIG. 5 is a partial plan view showing a superconducting device according to a second embodiment of the present invention.
Figure 6:
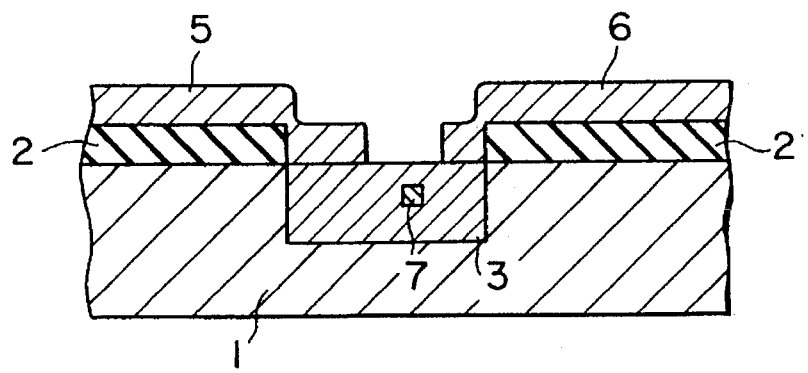
FIG. 6 is a sectional view of the superconducting device of the second embodiment taken along line A—A of FIG. 5.

A second embodiment of the present invention will be explained with reference to FIGS. 5 and 6. This embodiment is intended to control only the phase of carriers by applying an electric field as control means. As compared with the configuration shown in FIG. 1, the feature of the second embodiment lies in that the number of injection electrodes is increased to two and the control electrode 7 is divided into five units.

For forming a device, an ion implanted layer is formed in a manner similar to Embodiment 1.

Boron ions are then injected in the surface to a concentration of $9 \times 10^{18}$ $cm^{-3}$, followed by a heat treatment for ten minutes at a temperature of 900° C. in a nitrogen environment thereby to form a plurality of control electrodes 7. A total of five control electrodes are formed in the embodiment under consideration. After forming an opening 4 of the layer insulating film 2, an Nb thin film about 100 nm thick is deposited by ultra-high vacuum evaporation as a superconductor. The thickness of this superconducting thin film is selected in a range suitable for the next step of fine-fabrication in such a manner as not to adversely affect the superconductivity of the material. Although the thickness of about 100 nm is selected in the embodiment under consideration, it may alternatively be in the range from about 1 μm to about 10 nm or more preferably from about 100 nm to about 10 nm.

The next step forms a pattern by use of an electron-beam resist about 200 nm thick, and the Nb thin film is processed by the reactive ion etching process, thereby forming two first superconductors (injection electrode) 6 about 0.05 μm wide and a second superconductor 5 about 10 μm wide.

The present embodiment also uses an injection electrode 6 as a means for injecting carriers into an Si semiconductor working as a normal conductor. In each of the diagrams, it should be noted that all the parts are not necessarily illustrated on the same scale. A superconducting device according to the present invention is thus realized. Also in the present embodiment, the functions of the carrier injection means and the post-reflection carrier detection means are performed by the injection electrode 6 at the same time, thus achieving the objects of the present invention.

Further, since the two injection electrodes 6 may be used independently as a carrier injection means, the parallel processing of signals is possible in the device according to this second embodiment. This is a novel achievement yet to be realized by the conventional superconducting devices.

According to a third embodiment of the present invention, the phase and amplitude of carriers are both controllable by applying an electric field as control means.

Figure 7:
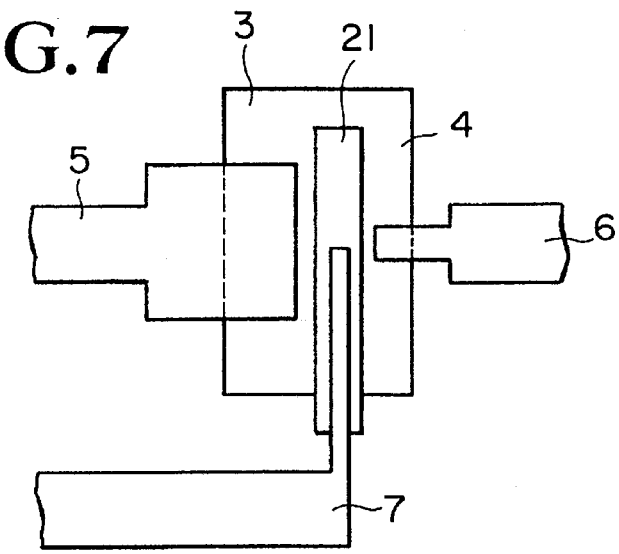
FIG. 7 is a partial plan view of a superconducting device according to a third embodiment of the present invention.

The third embodiment will be explained in detail with reference to FIG. 7, showing a plan view of a part of a superconducting device according to the that embodiment. The device of this embodiment may be fabricated by the same method as in the first embodiment except that a control electrode 7 is arranged differently. Specifically, unlike in the first embodiment with a control electrode 7 covering substantially a whole part between the first superconductor 6 and the second superconductor 5, the third embodiment is characterized by a control electrode 7 disposed selectively only at a part therebetween. This is done since carriers are reflected over the whole edge of the first superconductor in contact with the normal conductor so that a combination of the wave functions in terms of quantum mechanics affecting the current to the second superconductor is observed. As a result, the objects of the present invention are sufficiently achieved even in the case where, like in the third embodiment, the control electrode 7 is interposed over a part of the region between the first and second superconductors.

A fourth embodiment of the present invention is intended to control both the phase and amplitude of carriers by applying an electric field as control means.

Figure 8:
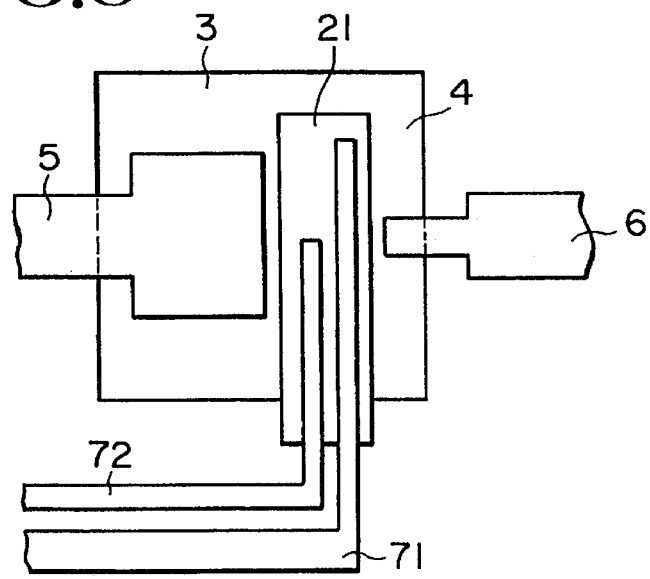
FIG. 8 is a partial plan view showing a superconducting device according to a fourth embodiment of the present invention.

The fourth embodiment will be explained with reference to FIG. 8, which illustrates a plan view of a part of a superconducting device according to that embodiment. In this embodiment, the method of device fabrication may be similar to that of the first and second embodiments, but the control electrode 7 in the fourth embodiment is arranged differently from either of these two embodiments. Specifically, although the first embodiment has the control electrode 7 provided over substantially a whole portion of the region between the first and second superconductors, the present embodiment is characterized by a control electrode 72 disposed only in a fraction of the region between the first and second superconductors, together with the control electrode 71 which is arranged over the substantially whole region between the first and second superconductors. Also in this case, as in the second embodiment of the present invention, carriers are reflected over the entire edge of the first superconductor in contact with the normal conductor, so that a combination of the wave functions in terms of quantum mechanics thereof is observed as an effect on the current to the second superconductor. In addition, the use of a plurality of control electrodes facilitates the processing of a plurality of input signals and setting the operating conditions of the device. It is thus possible to sufficiently achieve the objects of the present invention even when using a plurality of control electrodes some of which are confined only in a portion of the space between the first and second superconductors.

Figure 9:
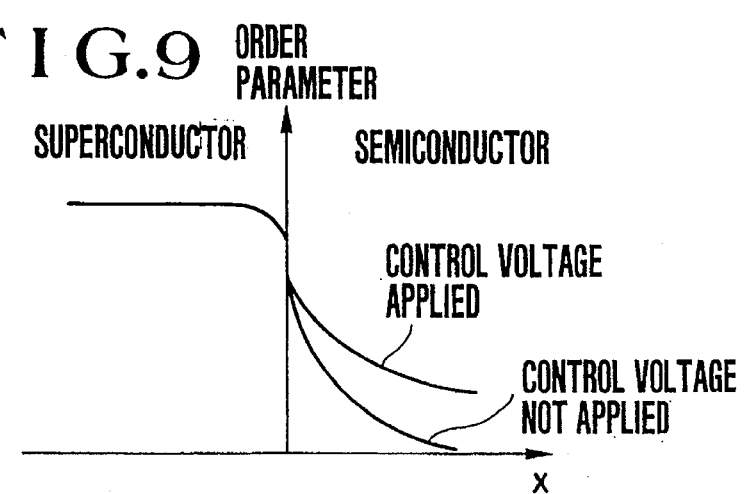
FIG. 9 shows the manner in which the superconducting pair potential spatially changes in value according to the fourth embodiment of the present invention.

In the above-described first, third and fourth embodiments, the control means using a voltage signal of field effect type controls the reflection of carriers between a superconductor and a normal conductor in the manner mentioned below. Specifically, the carriers injected (poured) in by way of the first superconductor 6 are differently reflected or assume different conditions depending on the form of the superconductive pair potential diffused into the normal conductor. FIG. 9 shows the superconductive pair potential assuming different values spatially depending on whether a voltage is applied or not applied to the control electrode. As seen from FIG. 9, a change in the superconducting order parameter at a specified position in the normal conductor causes a change in spatial position of reflection of carriers entering with the same energy E. This change has an effect on the current-voltage characteristic between the first and second superconductors.

A fifth embodiment of the present invention is for controlling only the phase of carriers by applying an electric field as control means.

Figure 10:
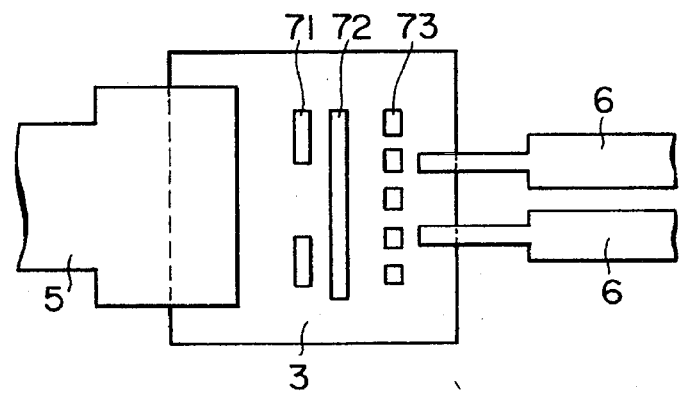
FIG. 10 is a partial plan view showing a superconducting device according to a fifth embodiment of the present invention.

The fifth embodiment will be explained below with reference to FIG. 10, showing a plan view of a superconducting device according to that embodiment. In this embodiment, the same method of device fabrication may be employed as in the second embodiment, although the control electrodes 7 are arranged at a position different from those in the second embodiment. Specifically, according to the second embodiment, control electrodes 7 are arranged in alignment symmetrically between the superconductor 5 and the injection electrodes 6, whereas the present embodiment has control electrodes 71, 72, 73 installed in three lines in symmetric positions. The carriers injected from the injection electrodes 6 are thus modulated three times by the control electrodes, reflected in the interface between the superconductor 5 and the ion implanted layer 3, and then modulated three times again before returning to the injection electrodes 6. This is due to the fact that carrier reflection occurs over the entire edge of the superconductor 5 in contact with the ion implanted layer 3 so that a combination of wave functions in terms of quantum mechanics in different phases is observed to have an effect on the current to the injection electrode. As a consequence, the objects of the present invention are sufficiently achieved even when a plurality of control electrodes 71, 72, 73 are between the superconductor and the injection electrode.

According to a sixth embodiment of the present invention, only the phase of carriers is controlled by applying an electric field to control means.

Figure 11:
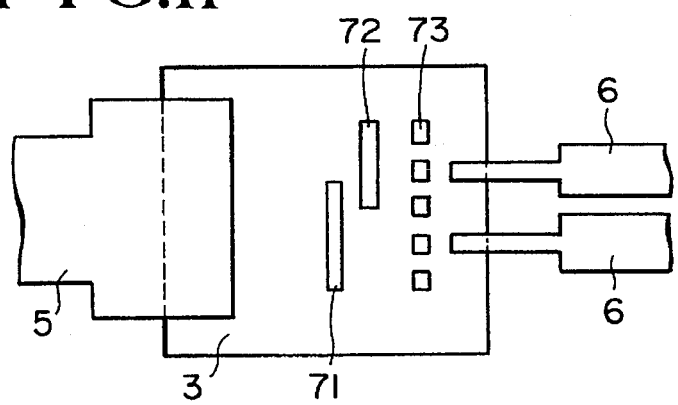
FIG. 11 is a partial plan view showing a superconducting device according to a sixth embodiment of the present invention.

A sixth embodiment of the invention will be explained with reference to FIG. 11 showing a partial plan view of a superconducting device according to that embodiment. In this embodiment, the device may be fabricated in the same way as in the second and fifth embodiments by controlling the carrier phase, although the control electrodes 7 are arranged in positions different from both the second and fifth embodiments. Specifically, according to the second embodiment, the control electrodes 7 are aligned at symmetric positions between the superconductor 5 and the injection electrodes 6, and according to the fifth embodiment, the control electrodes 71, 72, 73 are arranged symmetrically. In the present embodiment, by contrast, control electrodes 71, 72, 73 are arranged in three lines in an asymmetric manner. Also in this case, as in the fifth embodiment, carriers are reflected over the entire edge of the superconductor 5 in contact with the ion implanted layer 3, so that a combination of the wave functions in terms of quantum mechanics out of phase from each other is observed to have an effect on the current flowing to the injection electrode 6. In addition, the use of a plurality of control electrodes facilitates processing of a plurality of input signals or setting operating conditions of the device, thereby realizing more complicated device functions.

In the aforementioned second, fifth and sixth embodiments, the control means using a voltage signal of field effect type control carrier reflection between the superconductor and the normal conductor in the manner mentioned below. More specifically, the carriers injected by way of the injection electrode 6 are changed in the phase of wave function by applying a voltage to the control electrodes 71, 72, 73 in the ion implanted layer 3 making up a normal conductor. As a result, there occurs a phase difference of the wave function between the places where the control electrodes 71, 72, 73 are located and not located. Signals of superconducting electron wave returned to the injection electrodes by such a reflection phase conjugate in the interface between the superconductor 5 and the ion implanted layer 3 whose momentum vector is identical but reversed in sign before and after reflection, are changed in value by the interference effect. In a superconducting device according to the present invention, it is thus possible to effect parallel processing of a plurality of signals.

Figure 12:
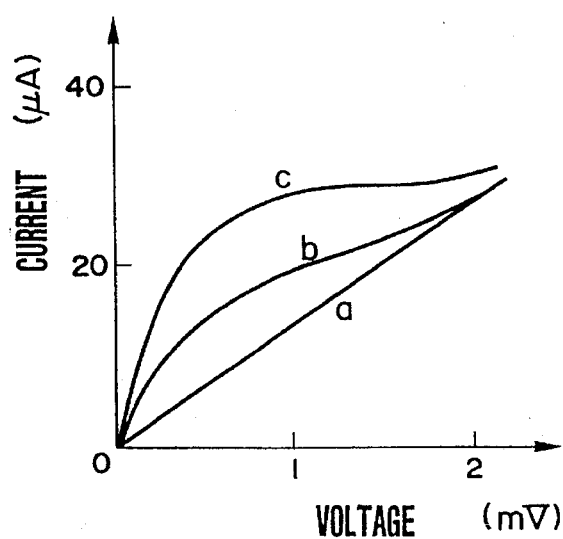
FIG. 12 shows voltage-current characteristics obtained when an electric field is applied and not applied respectively to a control electrode in the second, fifth and sixth embodiments of the present invention.

FIG. 12 is a diagram showing that the voltage-current characteristic between the superconducting electrode 5 and the injection electrodes 6, is different depending on whether a voltage is not applied, (curve a in FIG. 12) or applied (curves b, c in FIG. 12) to the control electrode of the second, fifth and sixth embodiments of the invention. The phase of wave function is changed by application of a voltage to the control electrode 7 or 71, 72, 73. This causes a phase difference of wave function between those places where a control electrode is located and not located, with the result that the signals of superconducting electron wave that have returned to the injection electrode are changed in value by the interference effect as described above.

According to a seventh embodiment, only the phase of carriers is controlled by applying an electric field as control means.

Figure 13:
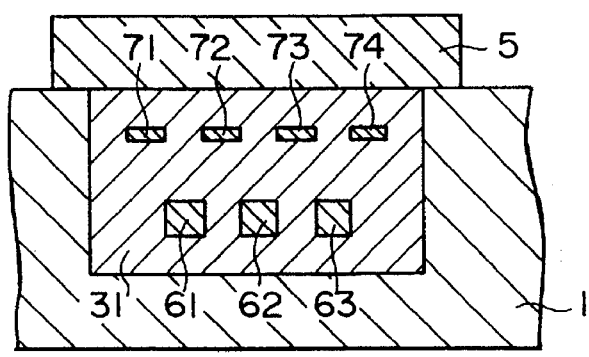
FIG. 13 is a cross-sectional side view showing a superconducting device according to a seventh embodiment of the present invention.

The seventh embodiment of the invention will be explained with reference to FIG. 13 showing a partial plan view of a superconducting device according to that embodiment. A portion making up a normal conductor 31 of p-type single crystal silicon, together with injection electrodes 61, 62 made up of p-type single crystal silicon and control electrodes 71, 72, 73, 74 made up of nickel silicide, is formed by the molecular beam growth method on the surface of a substrate 1 made of p-type silicon single crystal of (100) orientation. The portion of normal conductor 31 has a thickness of 0.3 μm. Finally, a superconductor 5 made up of an Nb thin film 5 having a thickness of 300 nm is formed by the ultrahigh vacuum evaporation, thus realizing a superconducting device according to the present invention.

In the embodiment mentioned above, a carrier accumulation layer is formed in a semiconductor to control the superconducting proximity effect. The present invention, however, is not limited to such control means. Instead, the objects of the present invention may also be sufficiently achieved by forming an inversion layer in a semiconductor and controlling the superconducting proximity effect of this particular portion.

Further, the conductivity of the semiconductor may be either p- or n-type. This is because a superconducting region diffuses into a semiconductor in either case by the superconducting proximity effect.

The first, third and fourth embodiments may use a MOS-type control means which has the highest reproducibility in the manufacturing processes if silicon is used for a semiconductor. The invention is, however, not limited to such control means, but may of course alternatively comprise MIS-type control means with a control conductor formed through an artificially-provided insulating material or MES-type control means utilizing the Schottky barrier. The use of control means of junction FET type with a p-n junction is also another preferable embodiment of the present invention. A control electrode embedded in a semiconductor as in the second, fifth, sixth or seventh embodiment is also desirable.

An eighth embodiment of the present invention is intended for controlling both the phase and amplitude of carriers by applying a magnetic field to control means.

Figure 14:
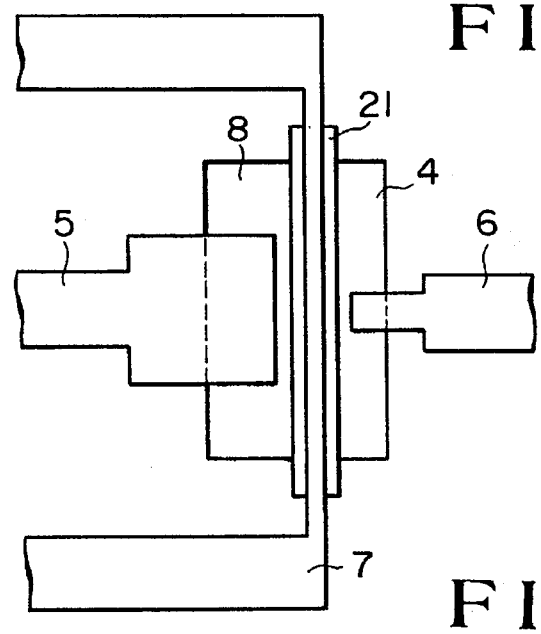
FIG. 14 is a partial plan view showing a superconducting device according to an eighth embodiment of the present invention.

The eighth embodiment of the invention will be explained with reference to FIG. 14, showing a partial plan view of a superconducting device according to that embodiment. A layer insulating film made of $SiO_2$ about 100 μm thick is formed by thermal oxidation on the surface of a substrate of p-type silicon single crystal of (100) orientation, both of which are not shown. A normal conductor 8 is formed as an Al thin film about 200 nm thick on the layer insulating film, and then a thin film made of $SiO_2$ about 100 nm thick is formed as an insulating film (not shown) by CVD (chemical vapor deposition), and after forming an opening 4 of the layer insulating film, a thin film of Nb about 100 nm thick is deposited by evaporation in ultrahigh vacuum. The thickness of this superconducting film is selected in a range suited to the next process of micro-fabrication and not adversely affecting the superconductivity of the material. In the next processes, a pattern is formed by electron beam resist about 200 nm thick and the Nb thin film is processed by the reactive ion etching method thereby to form a first superconductor 6 about 0.05 μm wide and a second superconductor 5 about 10 μm wide. In each drawing, it should be noted that the scale on which subassemblies are drawn is not necessarily identical. As the next step, a thin film of $SiO_2$ about 10 nm thick is formed as a gate insulating film 21 by CVD (chemical vapor deposition), after which an Al thin film about 200 nm thick is formed to provide a control electrode 7. A superconducting device according to the present invention is thus fabricated. According to the present embodiment, the control electrode 7 is used not for field effect but as a wiring for applying a magnetic field to the normal conductor 8. When a current is supplied to the control electrode 7, the phase of wave function of electrons or holes is changed by the magnetic field in the interface between the second superconductor 5 and the normal conductor 8. Furthermore, the superconducting pair potential of the normal conductor is decreased. As a result, as in the case of the electric field effect, the reflection coefficient of electrons or holes in the interface between the second superconductor 5 and the normal conductor 8 is appropriately controlled, and in this way, a superconducting device according to the present invention is successfully operated.

A ninth embodiment of the present invention is intended for controlling the phase alone of carriers by applying a magnetic field as control means.

Figure 15:
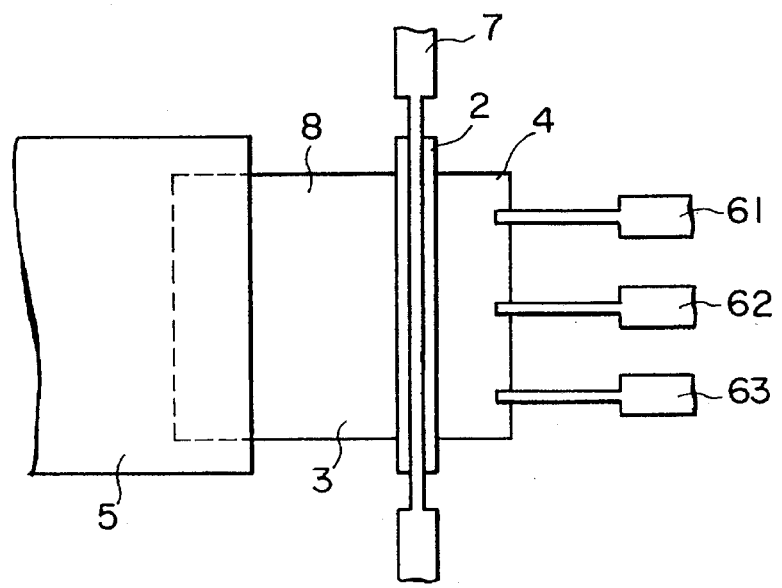
FIG. 15 is a partial plan view showing a superconducting device according to a ninth embodiment of the present invention.

The ninth embodiment of the present invention will be explained with reference to FIG. 15, showing a partial plan view of a superconducting device according to that embodiment. An Si semiconductor is used as a material of a normal conductor. Specifically, a layer insulating film of $SiO_2$ about 100 nm thick is formed by thermal oxidation on the surface of a substrate made of p-type silicon single crystal of (100) orientation, and arsenic ions are injected to the surface to a concentration of $5\times10^{18}$ cm$^{-3}$, followed by heat treatment for 20 minutes at a temperature of 900° C. in a nitrogen environment thereby to form an ion implanted layer 3. An opening 4 of the layer insulating film is then formed. In the subsequent processes, the same method may be used as in the second or fourth embodiment for fabricating a device according to the present embodiment, although the control electrode 7 is arranged differently and has different functions. More specifically, the embodiment under consideration has a feature in that the control electrode 7 covers substantially the whole space between the superconductor 5 and the injection electrodes 61, 62 and 63. The objects of the present invention may of course be achieved, however, also by disposing the control electrode 7 asymmetrically at a portion of the space between the superconductor 5 and the injection electrodes 6. The control electrode 7 makes up control means using application of a magnetic field. Also in this case, a charge in quantum mechanical wave functions is observed as an effect on the current flowing to the injection electrode.

A tenth embodiment of the present invention is intended to control both the phase and amplitude of carriers by applying a magnetic field as control means.

Figure 16:
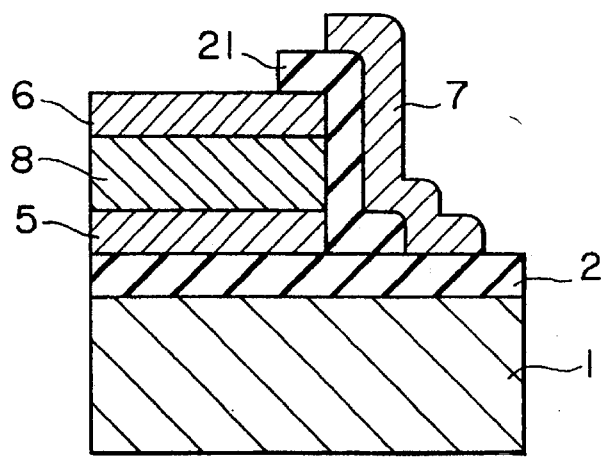
FIG. 16 is a cross-sectional side view showing a superconducting device according to a tenth embodiment of the present invention.

The tenth embodiment of the present invention will be explained with reference to FIG. 16 showing a partial cross-sectional side view of a superconducting device according to that embodiment. An insulating layer 2 of $SiO_2$ about 100 nm thick is formed by thermal oxidation on the surface of a substrate 1 made of p-type silicon single crystal of (100) orientation. In the next step, a Mo silicide thin film about 100 nm thick is deposited by evaporation in an ultrahigh vacuum, followed by forming a pattern using an electron beam resist about 200 nm thick. The Mo silicide thin film is processed by reactive etching method thereby forming a first superconductor 5 about 0.05 μm wide. The surface of this superconductor 5 is formed with a thin film of polycrystal Si about 50 nm thick by CVD (chemical vapor deposition) to provide a normal conductor 8, followed by the injection of arsenic ions to the surface concentration of $5\times10^{18}$ cm$^{-3}$. Then this subassembly is heat-treated for five minutes at the temperature of 900° C. in a nitrogen atmosphere to form an ion implanted layer (not shown). An Nb thin film about 100 nm thick is deposited by evaporation in an ultrahigh vacuum to form a second superconductor 6. A thin film of $SiO_2$ about 10 nm thick is formed as a gate insulating film 21 by CVD (chemical vapor deposition), and after that, an Al thin film about 200 nm thick is formed as a control electrode 7. These processes complete a superconducting device according to the present invention. In this embodiment, the superconducting device is arranged with a normal conductor sandwiched between means for injecting electrons or holes into the normal conductor and a superconductor. The control electrode 7 is of course usable either as an electric field effect type or as a magnetic field effect type.

Figure 17:
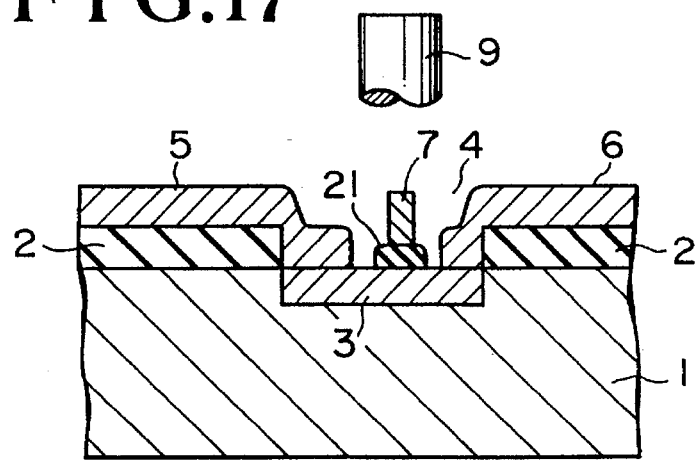
FIG. 17 is a cross-sectional side view showing a superconducting device according to an eleventh embodiment of the present invention.
Figure 18:
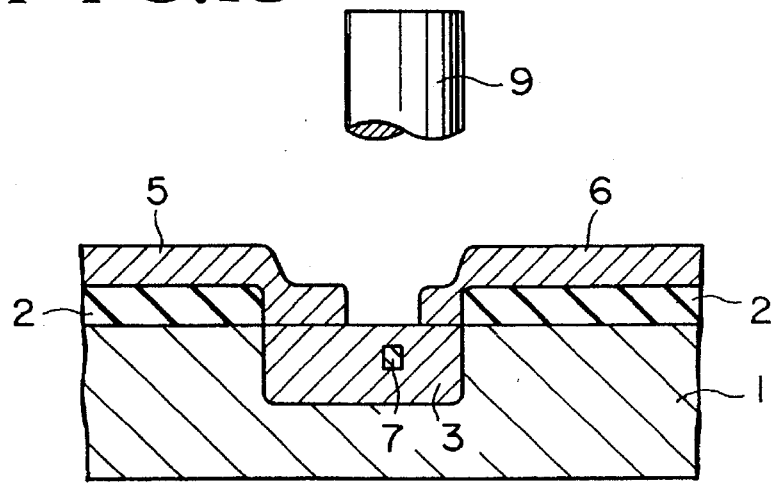
FIG. 18 is a cross-sectional side view showing another superconducting device according to the eleventh embodiment of the present invention.

An eleventh embodiment of the present invention is intended for controlling both the phase and amplitude of carriers by applying light or an electric field (FIG. 17), or controlling only the phase of carriers by applying light or electric field (FIG. 18).

The eleventh embodiment will be explained with reference to FIGS. 17 and 18 showing partial cross-sectional side views of a superconducting device according to that embodiment. A superconducting device shown in FIG. 17 is fabricated in the same way as in the first embodiment, and the superconducting device shown in FIG. 18 in the same manner as in the second embodiment. Both of the modifications of the present embodiment are different from the first and second embodiments respectively, however, in that each device according to the eleventh embodiment further comprises means for introducing light to a normal conductor region. An optical fiber 9 is used as such a light-introducing means. The light-introducing means, however, is not limited to an optical fiber, but may of course be an optical waveguide or a waveguide formed on the same substrate as the superconducting device according to the present invention. In this case, the incident light increases the carrier concentration in the normal conductor so that the value of the superconducting pair potential is changed spatially. The value of the superconducting order parameter at a specified position in the normal conductor thus undergoes a change, and the reflection coefficient or transmission probability of electrons or holes is changed in the same manner as when using control means by electric field effect, so that the current flowing across the interface between the normal conductor and the superconductor is controlled, thereby sufficiently achieving the objects of the present invention.

In the device according to the embodiment shown in FIG. 17, in which the control electrode 7 of MOS type is formed by an Al thin film, it is preferable to use an oxide semiconductor material such as $In_2O_3$ or $SnO_2$ in order to introduce the incident light effectively into the semiconductor. This is by reason of the fact that these materials, in spite of their high conductivity, are optically transparent, and therefore the device characteristics are controlled by the incident light as a signal in a more efficient manner.

A twelfth embodiment of the present invention is for controlling both the phase and amplitude of carriers by applying an electromagnetic wave as a control means.

Figure 19:
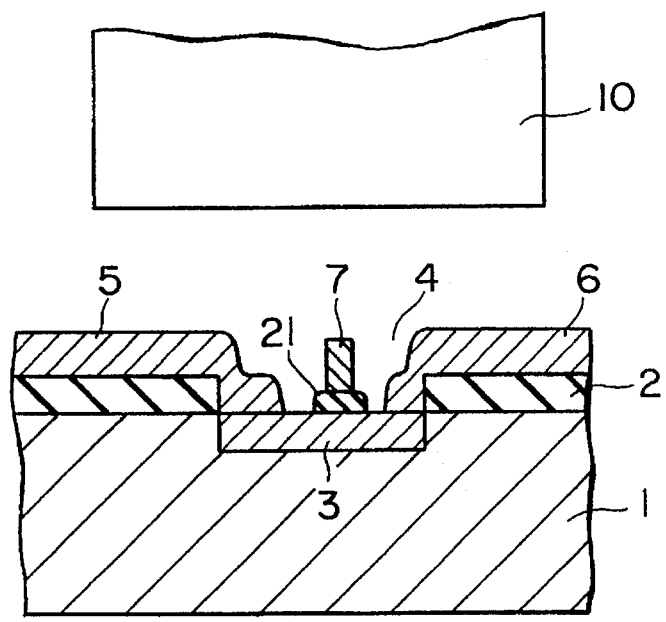
FIG. 19 is a cross-sectional side view showing a superconducting device according to a twelfth embodiment of the present invention.

The twelfth embodiment of the invention will be explained with reference to FIG. 19 showing a partial cross-sectional side view of a superconducting device according to that embodiment. This embodiment is similar to the first embodiment in the method of device fabrication, but differs therefrom in that the device according to the present embodiment further comprises means for introducing an electromagnetic wave into a normal conductor region. A waveguide 10 may be used as a means for introducing the electromagnetic wave, but is not the only means available for such a purpose. According to the present embodiment, the reflection coefficient or transmission probability of electrons or holes is changed by the incident electromagnetic wave thereby to control the current flowing across the interface between the normal conductor and the superconductor, thus sufficiently achieving the objects of the invention.

A thirteenth embodiment of the present invention is intended for controlling both the phase and amplitude of carriers by applying a combination of an electric field and a magnetic field as control means.

Figure 20:
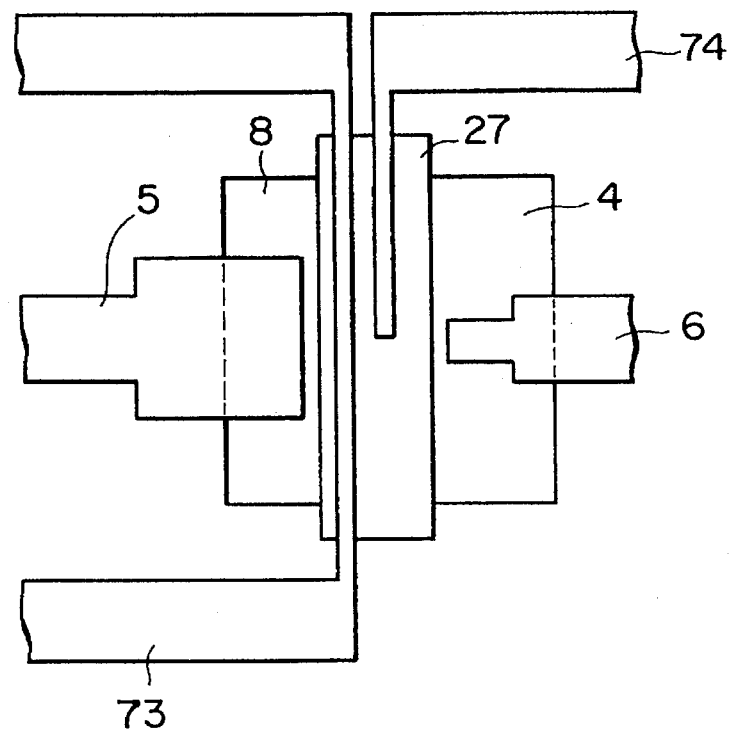
FIG. 20 is a partial top plan view showing a superconducting device according to a thirteenth embodiment of the present invention.

The thirteenth embodiment of the invention will be explained with reference to FIG. 20, showing a partial cross-sectional side view of a superconducting device according to that embodiment. An Si semiconductor is used as a material of a normal conductor. Specifically, a layer insulating film of $SiO_2$ about 100 nm thick is formed by thermal oxidation on the surface of a substrate made of p-type silicon single crystal of (100) orientation, after which arsenic ions are injected to the surface concentration of $5 \times 10^{18}$ cm$^{-3}$, followed by heat treatment for 20 minutes at the temperature of 900° C. in a nitrogen atmosphere thereby to form an ion implanted layer 8. Then, an opening 4 of the layer insulating film is formed. A thin film made of $SiO_2$ about 10 nm thick is then formed by chemical vapor deposition (CVD), after which an Al thin film of about 200 nm is formed to provide a control electrode 73, 74. According to the present embodiment, the device is fabricated in the same way as in the first, third, fourth or eighth embodiment, but the control electrodes 73 and 74 arranged differently and have a function different therefrom. More specifically, unlike in the eighth embodiment with the control electrode 7 covering substantially the whole space between the first and second superconductors, one of the control electrodes 73 is arranged to cover substantially the whole space between the first and second superconductors (5, 6) with an additional control electrode 74 selectively disposed at a portion of the space between the first and second superconductors. The control electrode 73 is a control means of an electric field effect type, and the control electrode 74 functions by application of a magnetic field. Even in the case where control means of these different types are combined, carriers are reflected over the whole edge of the first superconductor in contact with the normal conductor as in the third embodiment of the invention, so that a combination of quantum mechanical wave functions thereof is observed as an effect on the current flowing into the second superconductor. In addition, the use of a plurality of control electrodes facilitates the processing of a plurality of input signals of different types or setting the operating conditions of the device.

A fourteenth embodiment of the present invention is intended for configuring a superconducting circuit by combining a superconducting device according to the present invention with a conventional device.

Figure 21:
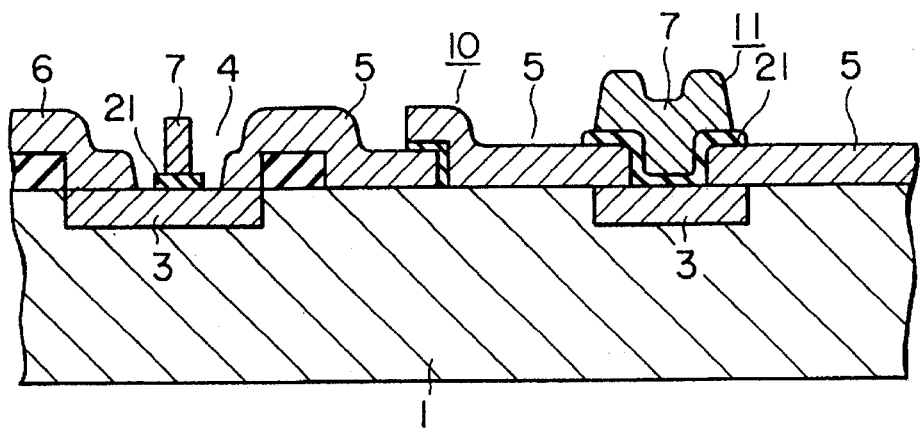
FIGS. 21 and 22 are cross-sectional side views showing a superconducting device according to a fourteenth embodiment of the present invention.
Figure 22:
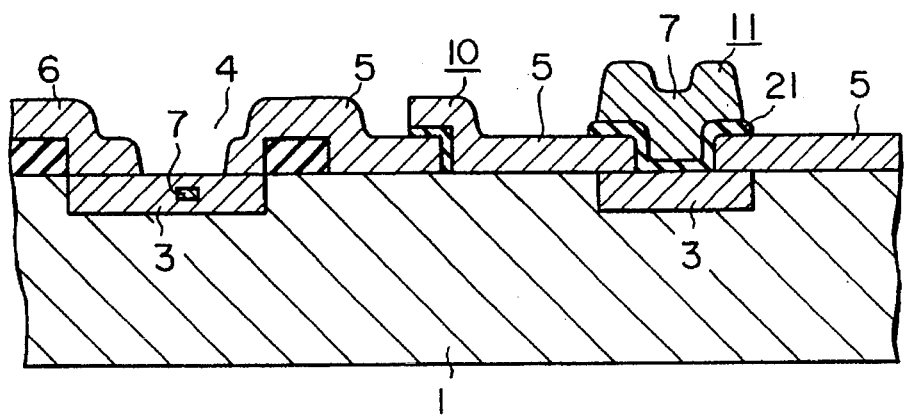

The fourteenth embodiment of the present invention will be explained with reference to FIGS. 21 and 22, which are partial cross-sectional views showing a superconducting circuit according to that embodiment. In this embodiment, the superconducting device of the first embodiment is used as shown in FIG. 21, and that of the second embodiment as shown in FIG. 22, each configuring a superconducting circuit by combining a tunnel-type Josephson junction element 10 using a superconductor or a field-effect superconducting transistor 11 as an embodiment of the present invention. If a circuit is configured by combining a conventional superconducting device in this way to make up a superconducting device according to the present invention as shown in FIGS. 17 and 18, the advantage results that a high circuit function and high-speed signal processing are attained at the same time for processing an optical signal detected by a superconducting device, thus providing a preferable embodiment of the present invention in view of the possibility of a sophisticated information processing that could not be realized by the prior art.

A fifteenth embodiment of the present invention is intended for controlling both the phase and amplitude of carriers by applying at least one of the voltage, current and magnetic field as control means.

Figure 23:
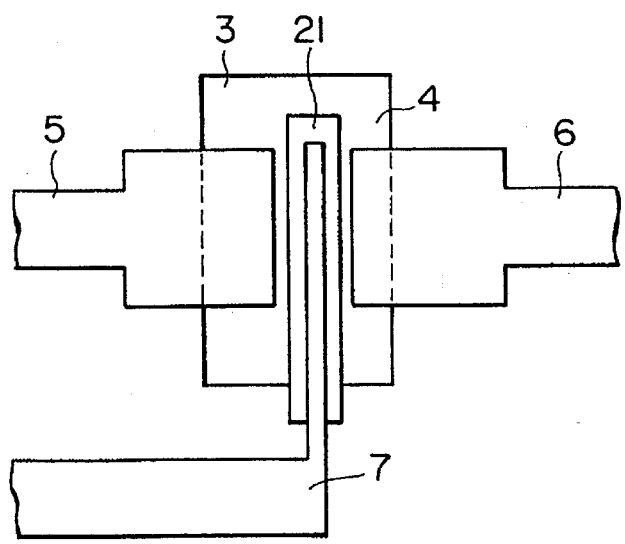
FIG. 23 is a top plan view showing a superconducting device according to a fifteenth embodiment of the present invention.
Figure 24:
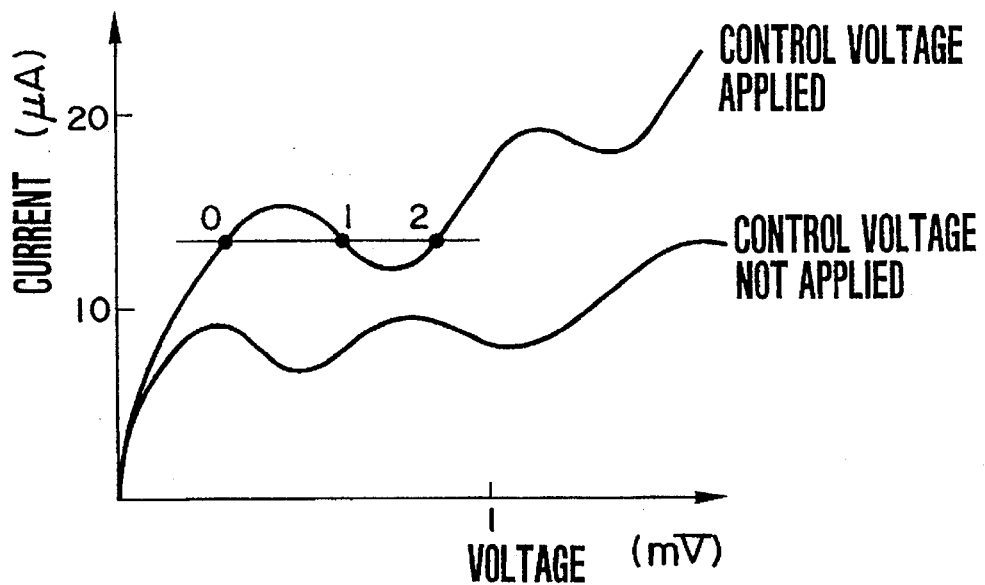
FIG. 24 shows a current-voltage characteristic between two superconductors of a device according to the fifteenth embodiment of the present invention.

The fifteenth embodiment of the present invention will be explained with reference to FIG. 23 showing a partial top plan view of a superconducting device according to that embodiment. This embodiment has a feature in that a superconducting device, which may be fabricated in the same manner as in the first embodiment, comprises a superconductor 6 making up means for injecting electrons or holes into a normal conductor. In the case where means for injecting electrons or holes into a normal conductor is thus configured of a superconductor, reflection of electrons or holes in the interface between two superconductors and a normal conductor occurs repeatedly. This configuration has a special advantage in that the current flowing through the normal conductor (semiconductor) and the superconductor in contact therewith is controlled to realize the same value of current or differential resistance under different conditions, thus making possible an operation corresponding to a binary or multi-valued logic. FIG. 24 shows a current-voltage characteristic between the two superconductors of the superconducting device according to the present invention. This represents a very preferable embodiment realizing a superconducting device having such a novel function that the characteristic thereof is capable of being controlled by a control signal of electric field effect type while operating the device in correspondence with the binary or multi-valued logic. Also in this case, the current may of course be controlled by selected one or a combination of any of the voltage, current and magnetic field to operate the device according to the present invention. This current control is associated with a quite novel embodiment of the present invention which is operated by interference control of interference of wave functions of electrons or holes injected into a normal conductor (semiconductor). It will be easily understood from the configuration of the superconducting device according to the present invention that the interference phenomenon mentioned above is realized by providing current control means only in a portion of the normal conductor and superposing wave functions of differently-controlled electrons or holes one on another.

A sixteenth embodiment of the present invention concerns a superconducting device having an analog signal processing function.

Figure 25:
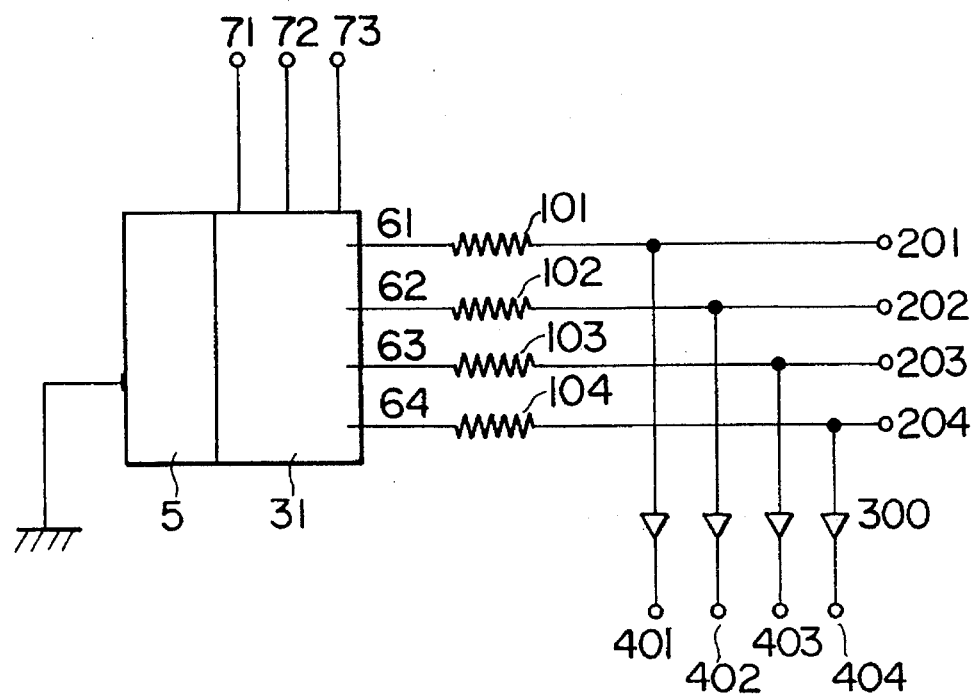
FIG. 25 is a block diagram showing a superconducting device according to a sixteenth embodiment of the present invention and a method of using the same.

FIG. 25 is a block diagram showing a superconducting device and a method of fabrication thereof according to the sixteenth embodiment of the present invention. Control electrodes 71, 72, 73 and injection electrodes 61, 62, 63, 64 are formed on a superconductor 5 of an Nb thin film and a normal conductor 31 of Si to make up a superconducting device according to the present invention. The injection electrodes 61, 62, 63, 64 also function as means for detecting carriers reflected, as well as carrier injection means. The injection electrodes 61, 62, 63, 64 are connected through resistors 101, 102, 103, 104 to power terminals 201, 202, 203, 204 each of which is supplied with a constant current. As a consequence, voltage signals parally controlled by the signals of the control electrodes 71, 72, 73, 74 are produced from the power terminals 201, 202, 203, 204. The superconductor 5 provides the ground potential as a voltage reference of the outputs at the terminals 201 to 204. In other words, the voltages at the terminals 201 to 204 make up potential differences between the superconductor 5 and the injection electrodes 61 to 64 respectively. From the viewpoint of high-speed device operation, these voltage signals are desirably used as they are. In another very preferable embodiment of the present invention, however, a high-speed device such as a superconducting transistor is used as an amplifier 300 and outputs 401, 402, 403, 404 thereof are used as output signals of the device. In this embodiment, three types of signal are processed in parallel to produce four types of output signals. In this way, according to the present invention, signals are processed in multiplex or parallel manner by use of the wave characteristic of carriers. A function such as this is often utilized to realize a sophisticated information processing function in the field of optical devices. It provides, however, a quite novel application in the field of solid-state devices or electronic devices, especially, superconducting devices. A superconducting device according to the present invention, therefore, is expected to find suitable applications in the neuro-computer devices and artificial intelligence devices.

Figure 26:
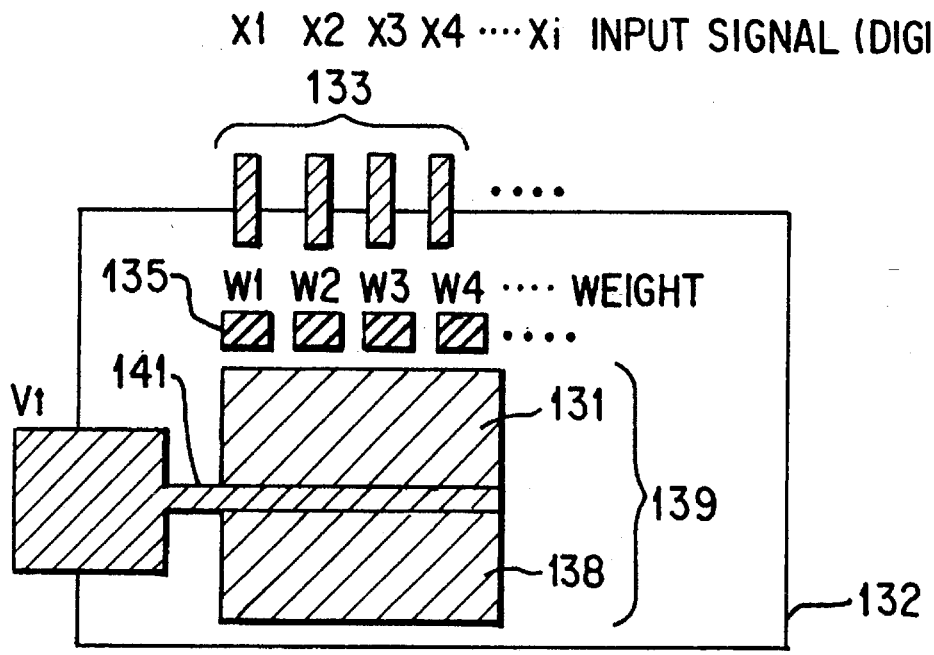
FIG. 26 is a schematic view showing a configuration of a threshold logical circuit according to a seventeenth embodiment of the present invention.

FIG. 26 shows a configuration of a threshold logical circuit of a device which is a seventeenth embodiment of the present invention. This device includes injection electrodes 133 made of Nb from which a plurality of input signals Xi are input. The injection electrodes 133 are provided on a semiconductor 132 of Si at positions opposing a first superconductor electrode 131. The device also includes a plurality of input electrodes 135 made of polycrystalline Si for performing weighting in correspondence to respective input signals. Furthermore, a second superconductor electrode 138 is formed at an end opposite to the first superconductor electrode 131. A gate electrode 141 is provided through an insulating film between the first and second superconductor electrodes 131 and 138. Thus, a superconducting transistor 139 is formed. This superconducting transistor 139 is used as a threshold section, and a sum of weighted input signals $\Sigma XiWi$ is compared with a predetermined threshold value Ti. Based on the result of this comparison, an output signal is output as a voltage between the first and second superconductor electrodes 131 and 138.

Figure 28A:
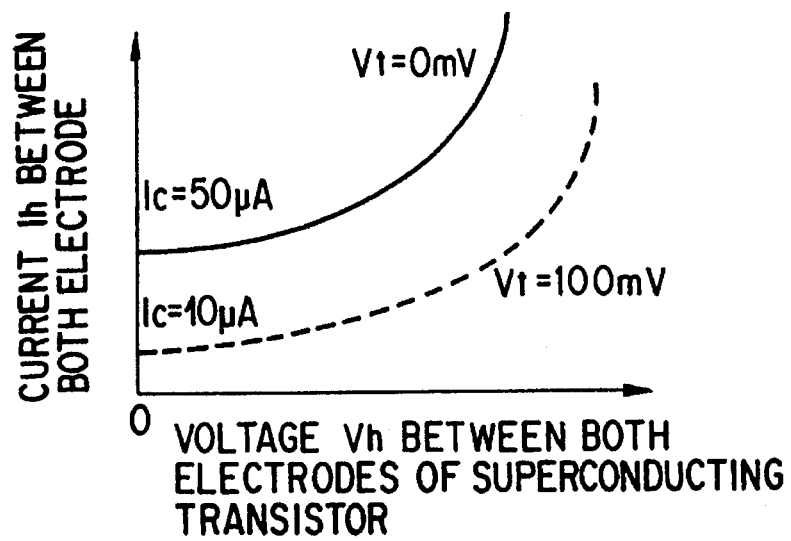
FIG. 28A shows a current-voltage characteristic between both electrodes of a superconducting transistor at a threshold section of the threshold logical circuit of FIG. 26.
Figure 28B:
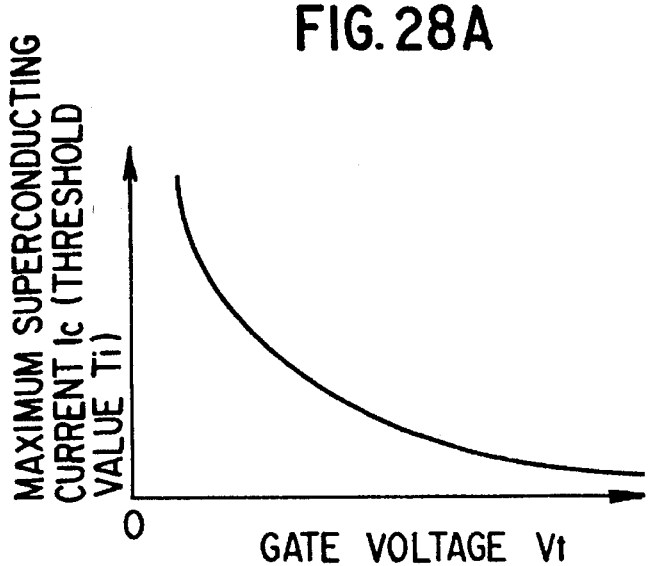
FIG. 28B shows a relationship between a threshold current Ti and a gate voltage Vt at the threshold section of the threshold logical circuit of FIG. 26.

FIG. 28A shows a current-voltage characteristic between the first superconductor electrode 131 and the second superconductor electrode 138 of the device illustrated in FIG. 26. When a superconducting current reaches a maximum superconducting current Ic at a voltage Vh of zero volts between the first and second superconductor electrodes, a voltage-present state is produced between the first and second superconductor electrodes. FIG. 28B shows a change of the maximum superconducting current Ic with a gate voltage Vt. This maximum superconducting current Ic is controlled by a gate voltage Vt. When the maximum superconducting current Ic is used as the threshold value Ti, it is possible to vary the threshold value Ti by the gate voltage Vt.

Figure 27:
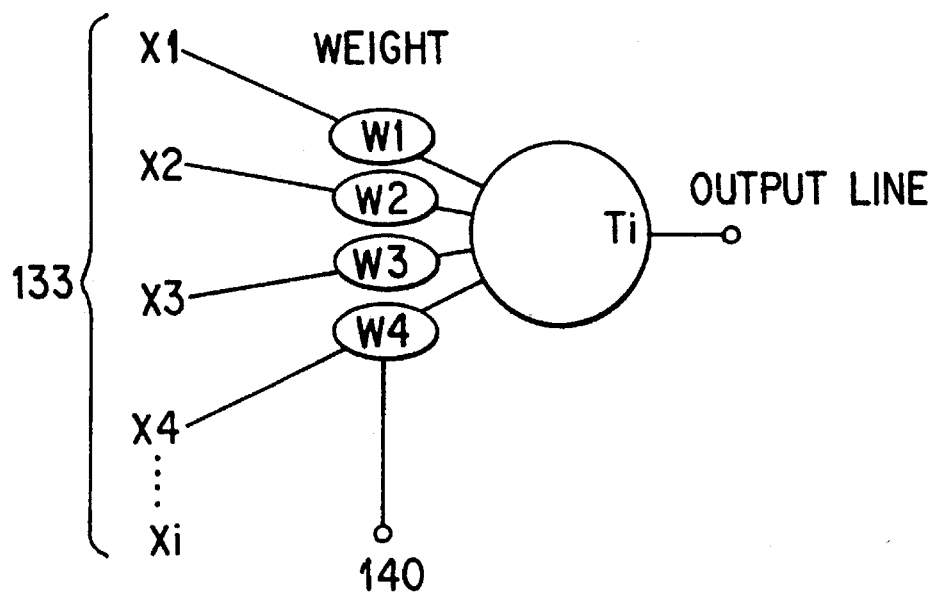
FIG. 27 is a schematic diagram useful to explain the operation of the threshold logical circuit of FIG. 26.

FIG. 27 is a schematic diagram for explaining the operation of the threshold logical circuit of FIG. 26. For example, digital signals of "0" or "1" are applied to the plurality of injection electrodes 133, and the sum $\Sigma XiWi$ of the weighted digital signals is compared with the threshold value Ti. When the sum $\Sigma XiWi$ exceeds the maximum superconducting current Ic of the superconducting transistor which is the threshold value Ti, a voltage is present (a voltage state) between both the superconducting electrodes so that the output goes to a value "1". Otherwise the output goes to a value "0", which represents a zero voltage state. In this manner the logical circuit can perform the logical operation by outputting an output signal value of "1" or "0", which is delivered to an output line. Furthermore, the threshold logical device of the present invention has a function of varying the weight in accordance with learning, and a function of performing summing of weighted input signals and switching the element. Since the threshold characteristic can be differentiated, it is possible to use a back propagation method which is used as a learning method in neuron element. As a result, the weight can be controlled by a weight control signal supplied from a weight control line 140. Furthermore, the threshold value can be controlled in a simple way by an external voltage.

In this embodiment, it is possible to realize a complicated logic function with the threshold logical device of a simple configuration constituted by a single element. If this device is employed, the learning can be achieved in a simple way and at high speed. Accordingly, an advantage is that an effective neuron circuit can be provided. Furthermore, since the dimension of one element is fine and the logical device can be formed with a small number of elements, another advantage is provided in that it is possible to realize a threshold logical device which is highly integrated and which is operated with small power consumption.

In this embodiment, while the superconductor is used as an electrode for injecting electrons, a similar advantage can be obtained by using a normal conductor. Furthermore, the means for injecting carriers may be structured by using a superconductor electrode formed through a tunnel barrier layer to obtain the similar advantage. In this case, in the current-voltage characteristic of the element, a voltage level at which an excessive current is detected is shifted to the low energy side by an amount corresponding to gap energy of the superconductor electrode at the injection side.

Figure 29:
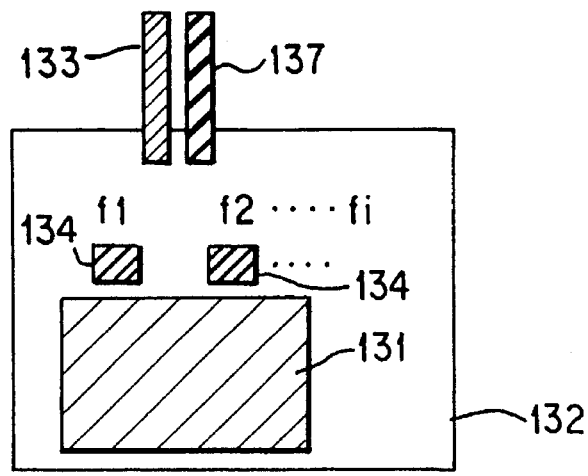
FIG. 29 is a schematic view showing a configuration of a detector according to an eighteenth embodiment of the present invention.

FIG. 29 shows a configuration of a detector which is a device according to an eighteenth embodiment of the present invention. This device includes an injection electrode 133 for inputting an input signal provided on a semiconductor 132 of Si and opposing a superconductor electrode 131, an output electrode 137 for outputting a result of detection of the input signal, and a plurality of input electrodes 134 provided on the semiconductor 132 of Si for receiving reference signals fi.

Figure 30A:
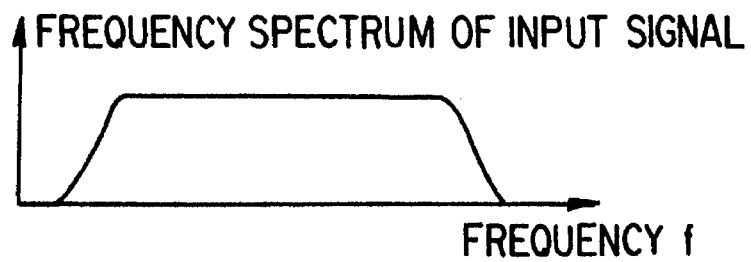
FIGS. 30A, 30B, 30C and 30D are diagrams showing respective frequency spectra of an input signal, reference signals f1 and f2, and a signal after detection.
Figure 30B:
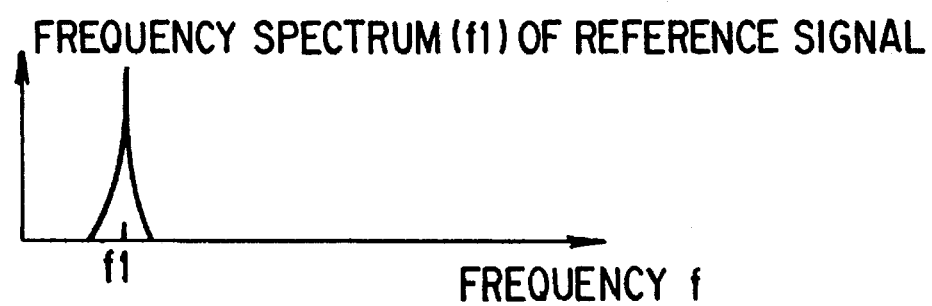
Figure 30C:
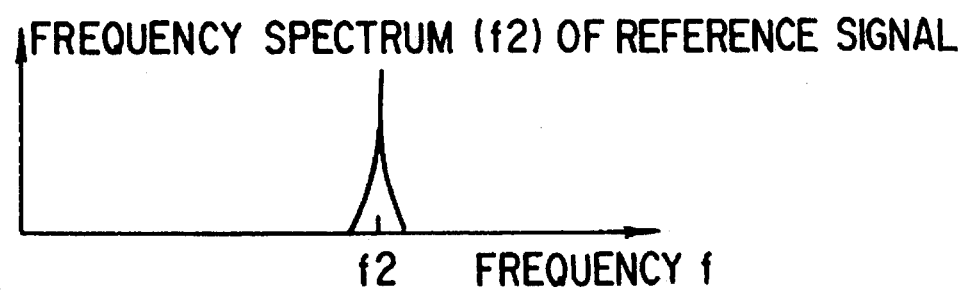
Figure 30D:
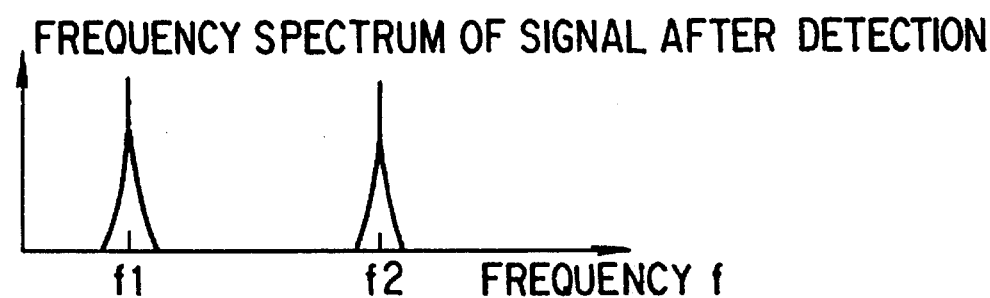

A wide band signal including frequency components from a low frequency to a high frequency is applied to the injection electrode 133. When a signal of a frequency which is desired to be detected is applied to the input electrode 134 as a reference signal, it is possible to take out and detect a signal which is tuned to a frequency of the input signal in correspondence to the degree of modulation. Such a signal can be detected by the electrode 137. For example, an input signal having a frequency spectrum as shown in FIG. 30A is applied to the injection electrode 133, a reference signal having a frequency f1 as shown in FIG. 30B is applied to one input electrode 134 and a reference signal having a frequency f2 as shown in FIG. 30C is applied to the other input electrode 134. Then, a phase of electron wave within the semiconductor 132 is modulated. As a result, a signal which is tuned to the frequencies f1 and f2 of the input signals is detected, and the frequency spectrum of the detected signal has a frequency spectrum as shown in FIG. 30D. As a result, it is possible to clarify the frequency components contained in the input signals.

In this embodiment, it is possible to structure a detector having a simple configuration, and which is highly sensitive and operable at high speed.

What is claimed is:

1. A superconducting switching device with a three terminal structure, comprising:

(a) a first solid member containing therein carriers following Fermi statistics;

(b) a second solid member, disposed in contact with the first solid member, containing therein carriers following Bose statistics;

(c) means for injecting carriers according to Fermi statistics into the first solid member;

(d) means for detecting carriers reflected adjacent to an interface between the first and second solid members by Andreev reflection and propagating through the first solid member; and (e) means for controlling at least a selected one of phase and amplitude of wave-functions of the Andreev reflected carriers propagated through said first solid member to control current which flows between said first solid member and said means for injecting carriers;

wherein a distance between the second solid member and the means for injecting carriers is equal to or smaller than ten times a mean free path of carriers in the first solid member; and wherein a potential difference V between the first solid member and the means for injecting carriers is $0<V<2\Delta g$, wherein $\Delta g$ is a value of the gap energy at an operating temperature of the superconducting device.

2. A superconducting switching device according to claim 1, wherein the detecting means and the injecting means together comprise a superconductor layer to allow injecting of the carriers following Fermi statistics to the first solid member and detecting of said carriers from the first solid member.

3. A superconducting switching device according to claim 2, wherein a width of the second solid member is greater than a width of the superconductor layer.

4. A superconducting switching device according to claim 1, wherein the carriers propagating through the first solid member are controlled by applying a control signal selected from the group consisting of an electric field, current, a magnetic field, light and electromagnetic wave to the first solid member.

5. A superconducting switching device according to claim 1, wherein said distance between the second solid member and the means for injecting carriers is greater than ten times a superconducting coherence length in the first solid member.

* * * * *